(12) United States Patent
Goto et al.

(10) Patent No.: US 10,763,384 B2
(45) Date of Patent: Sep. 1, 2020

(54) CONCENTRATING SOLAR CELL MODULE

(71) Applicant: SHIN-ETSU CHEMICAL CO., LTD., Tokyo (JP)

(72) Inventors: Wataru Goto, Annaka (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 177 days.

(21) Appl. No.: 16/016,947

(22) Filed: Jun. 25, 2018

(65) Prior Publication Data

US 2018/0309007 A1    Oct. 25, 2018

Related U.S. Application Data

(62) Division of application No. 14/144,834, filed on Dec. 31, 2013, now Pat. No. 10,134,934.

(30) Foreign Application Priority Data

Feb. 13, 2013    (JP) .................................. 2013-025727

(51) Int. Cl.
*H01L 31/052*    (2014.01)
*H01L 31/02*    (2006.01)
(Continued)

(52) U.S. Cl.
CPC ............ *H01L 31/052* (2013.01); *F24S 23/30* (2018.05); *H01L 31/02008* (2013.01);
(Continued)

(58) Field of Classification Search
CPC .......................... H01L 31/048; H01L 31/0543
See application file for complete search history.

(56) References Cited

U.S. PATENT DOCUMENTS 4,638,110 A    1/1987    Erbert
5,125,983 A    6/1992    Cummings
(Continued)

FOREIGN PATENT DOCUMENTS

JP    S56-53370 U    5/1981
JP    H09-083006 A    3/1997
(Continued)

OTHER PUBLICATIONS

Nov. 17, 2015 Office Action issued in Japanese Patent Application No. 2013-025727.
(Continued)

*Primary Examiner* — Sadie White
(74) *Attorney, Agent, or Firm* — Oliff PLC

(57)    ABSTRACT

A concentrating solar cell module including; a base portion having a plurality of mounting regions for mounting solar cells and a plurality of lead electrodes for electrically connecting the solar cells with external electrodes; a support composed of a thermosetting resin, the support surrounding each of the mounting regions of the base portion; the solar cells mounted on the mounting regions; and a condensing lens molded above the mounting regions so as to encapsulate the solar cells, wherein a surface of the mounting regions of the base portion is plated, the condensing lens is molded with a transparent thermosetting silicone resin, and the support is joined to a surface of the base portion, the surface to which the support is joined is on the same side of the base portion as the surface on which the solar cells are mounted.

10 Claims, 5 Drawing Sheets

(51) Int. Cl.
*H01L 31/048* (2014.01)
*H01L 31/054* (2014.01)
*F24S 23/30* (2018.01)
*H02S 40/42* (2014.01)

(52) U.S. Cl.
CPC ........ *H01L 31/048* (2013.01); *H01L 31/0543* (2014.12); *H02S 40/42* (2014.12); *Y02E 10/52* (2013.01)

(56) References Cited

U.S. PATENT DOCUMENTS

| | | | |
|---|---|---|---|
| 5,460,659 | A | 10/1995 | Krut |
| 2003/0095340 | A1 | 5/2003 | Atwater et al. |
| 2008/0185034 | A1 | 8/2008 | Corio |
| 2008/0224161 | A1 | 9/2008 | Takada |
| 2010/0124794 | A1 | 5/2010 | Iwasaki et al. |
| 2010/0163098 | A1 | 7/2010 | Clemens et al. |
| 2010/0236603 | A1 | 9/2010 | Menard et al. |
| 2011/0048501 | A1 | 3/2011 | Jaus et al. |
| 2012/0138997 | A1* | 6/2012 | Tasaki .................. G02B 5/0808 257/98 |
| 2012/0187439 | A1* | 7/2012 | Bosch .................. H01L 31/0236 257/98 |
| 2013/0125973 | A1* | 5/2013 | Furihata ............ H01L 31/02243 136/256 |
| 2014/0130845 | A1 | 5/2014 | Ohki |

FOREIGN PATENT DOCUMENTS

| | | |
|---|---|---|
| JP | 2000-068547 A | 3/2000 |
| JP | 2008-227166 A | 9/2008 |
| JP | 2010-123620 A | 6/2010 |
| JP | 2011-151276 A | 8/2011 |
| JP | 2012-186266 A | 9/2012 |
| JP | 2013-012605 A | 1/2013 |

OTHER PUBLICATIONS

Feb. 18, 2016 Office Action Issued in U.S. Appl. No. 14/144,834.
Mar. 15, 2016 Office Action issued in Japanese Application No. 2013-025727.
Aug. 22, 2016 Office Action Issued in U.S. Appl. No. 14/144,834.
Nov. 3, 2017 Office Action issued in U.S. Appl. No. 14/144,834.
May 10, 2018 Office Action issued in U.S. Appl. No. 14/144,834.

* cited by examiner (A)

(B)

(C)

(D)

CONCENTRATING SOLAR CELL MODULE

This is a Divisional of application Ser. No. 14/144,834 filed Dec. 31, 2013. The entire disclosures of the prior application is hereby incorporated by reference herein its entirety.

BACKGROUND OF THE INVENTION

Field of the Invention

The present invention relates to a concentrating solar cell module having a structure for concentrating and irradiating a solar cell with high-energy sunlight and a method for producing the same.

Description of the Related Art

As a system of a solar module, a flat plate system in which solar cells are arranged over a sunlight-receiving surface is often used. Unfortunately, solar cells, which are arranged according to the area of the receiving surface, have a high cost, and hence the solar module also has a high cost. From such a background, a concentrating solar cell module in which sunlight is concentrated on a small-diameter solar cell by a condensing lens has been developed. The concentrating solar cell module allows the number of required solar cells to be reduced by concentrating light several hundred times in comparison with the flat plate system.

The concentrating solar cell module that concentrates light several hundred times needs a sunlight-receiving surface having a mechanism of tracking the movement of the sunlight, resulting in an increase in cost and an increase in size of the solar module to install this mechanism.

In order to solve the problem, a concentrating solar cell module having a resin structure for concentration (e.g., fresnel lens and convex lens), formed above solar cells, has been proposed to reduce the size and cost of the solar module (see Patent Document 1). In Patent Document 1, concentration structures each composed of materials having different refractive indexes are formed in a recess of a support.

CITATION LIST

Patent Literature

[Patent Document 1] Japanese Patent Application Publication No. H9-83006

SUMMARY OF THE INVENTION

Unfortunately, the concentrating solar cell module in Patent Document 1 has problems in that light enters the support to reduce the photoelectric conversion efficiency and selection of materials for the support and the concentration structure is complicated.

Further, in the concentrating solar cell module, the temperature of the solar cells reaches 80° C. or higher during irradiation with light. This results in a problem of a decrease in the output of the concentrating solar cell module. Therefore, it is important for concentrating solar cell modules to improve heat dissipation properties and increase photoelectric conversion efficiency.

The present invention has been made in view of the above situations, and an object of the present invention is to provide a concentrating solar cell module having high heat dissipation properties and a high photoelectric conversion efficiency, and a method for producing the concentrating solar cell module.

In order to achieve the object, the present invention provides a method for producing a concentrating solar cell module comprising the steps of: preparing a base portion having a plurality of mounting regions for mounting solar cells and a plurality of lead electrodes for electrically connecting the solar cells with external electrodes, and a support composed of a thermosetting resin, the support surrounding each of the mounting regions of the base portion; mounting the solar cells on the mounting regions; molding a condensing lens above the mounting regions so as to encapsulate the solar cells, plating a surface of the mounting regions of the prepared base portion after the preparing step and before the mounting step; and joining the support to the base portion after the mounting step and before the molding step, wherein in the molding step, the condensing lens is molded with a transparent thermosetting silicone resin.

Such a method enables production of a concentrating solar cell module excellent in photoelectric conversion efficiency, heat resistance, and durability by molding the condensing lens with a transparent thermosetting silicone resin. Also, the method including plating the surface of the mounting regions enables production of a concentrating solar cell module having improved heat dissipation properties and capable of suppressing degradation of photoelectric conversion efficiency due to high temperature. In addition, a method of joining the support to the base portion increases degree of design freedom, such as the shape of the support, and simplifies surface treatment of the support.

In the method, the support joined to the base portion in the joining step preferably has an inner wall surface coated with metal by vapor deposition or plating.

In this manner, a concentrating solar cell module having a further improved photoelectric conversion efficiency can be produced at low cost.

The support prepared in the preparing step preferably has an upper portion extending toward a center of the mounting region.

A concentrating solar cell module produced according to such a method in a manner that the solar cells are connected to the respective lead electrodes by wire bonding can suppress light absorption due to wires because the wires are surrounded by the support. Such a method can also largely reduce influence of the wires on design of the condensing lens, resulting in simplified optical design.

In the mounting step, the solar cells being mounted are preferably connected to the respective plated mounting regions through a metal or a conductive thermosetting silicone resin.

In such a manner, a concentrating solar cell module having more excellent heat dissipation properties can be produced.

After the molding step, a part of the base portion may be cut to form an electric circuit.

In such a manner, an electrical connection state of each solar cell can be checked in the course of producing the concentrating solar cell module, and thereby a failure solar cell can be sorted out. Accordingly, the inspection in the steps can be simplified, and the cost can be reduced.

The condensing lens may be molded by compression molding, transfer molding, injection molding, or cast molding in the molding step.

In such a manner, the production can be simplified, the production efficiency can be improved, and the cost can be reduced.

After the molding step, the concentrating solar module may be cut by dicing into individual concentrating solar modules.

Such a method enables mass production of the concentrating solar cell modules, thereby reducing the cost.

Furthermore, the present invention provides a concentrating solar cell module comprising: a base portion having a plurality of mounting regions for mounting solar cells and a plurality of lead electrodes for electrically connecting the solar cells with external electrodes; a support composed of a thermosetting resin, the support surrounding each of the mounting regions of the base portion; the solar cells mounted on the mounting regions; and a condensing lens molded above the mounting regions so as to encapsulate the solar cells, wherein a surface of the mounting regions of the base portion is plated, the condensing lens is molded with a transparent thermosetting silicone resin, and the support is joined to the base portion.

Such a concentrating solar cell module is excellent in photoelectric conversion efficiency, heat resistance, and durability due to the condensing lens molded with a transparent thermosetting silicone resin. Further, the heat dissipation properties are improved by the plating on the surface of the mounting regions. Therefore, degradation of the photoelectric conversion efficiency due to high temperature can be suppressed. In addition, the support being joined to the base portion increases design freedom, such as the shape of the support, and can be readily subjected surface treatment.

The support is preferably molded with a thermosetting resin that contains a silicone resin and has a reflectance of 90% or more with respect to a light with a wavelength ranging from 350 nm to 900 nm.

Such a concentrating solar cell module can surely improve its photoelectric conversion efficiency, heat resistance, and durability.

An inner wall surface of the support is preferably coated with metal by vapor deposition or plating.

Such a concentrating solar cell module can further improve its photoelectric conversion efficiency, and reduce its cost.

The support preferably has an upper portion extending toward a center of the mounting region.

Such a concentrating solar cell module, in the case of connecting the solar cells to the respective lead electrodes by wire bonding, can suppress light absorption due to wires because the wires are surrounded by the support. Such a concentrating solar cell module can also largely reduce influence of the wires on design of the condensing lens, enabling various optical design to be applied.

The mounted solar cells are preferably connected to the respective plated mounting regions through a metal or a conductive thermosetting silicone resin.

Such a concentrating solar cell module is excellent in heat dissipation properties.

The support may be formed from at least one material selected from a thermosetting silicone resin, an organic modified silicone resin, and a mixed resin of an epoxy resin and a silicone resin.

Such a concentrating solar cell module is excellent in light stability and heat resistance.

The support may contain at least one selected from the group consisting of a filler, a dispersing agent, a pigment, a fluorescent substance, a reflective substance, a light-shielding substance, and a fibrous inorganic material.

Such a concentrating solar cell module, containing at least one selected from the above group according to purpose, has high durability and high photoelectric conversion efficiency due to the support having higher reflectivity and higher strength.

In the production of a concentrating solar cell module according to the present invention, the surface of each of the mounting regions of the base portion is plated, and the condensing lens is molded with a transparent thermosetting silicone resin. The produced concentrating solar cell module of the present invention is therefore excellent in the photoelectric conversion efficiency and the heat resistance, has improved heat dissipation properties, and can suppress degradation of photoelectric conversion efficiency due to high temperature. In addition, a method of joining the support to the base portion after the mounting step increases design freedom, such as a support surrounding wires for connecting solar cells to lead electrodes, and also simplifies surface treatment of the support, such as plating of an inner wall surface of the support.

DETAILED DESCRIPTION OF THE PREFERRED EMBODIMENTS

Hereinafter, embodiments of the present invention will be described, but the present invention is not limited to these embodiments.

As described above, it is important not only to produce a concentrating solar cell module having a high photoelectric conversion efficiency but also to maintain the high photoelectric conversion efficiency by improving the heat dissipation properties.

The present inventors have extensively investigated to solve this problem. As a result, the inventors have found that the problem can be solved by plating the surface of each of mounting regions for mounting solar cells. The inventors have also found that a method of joining a support to abase portion after mounting solar cells allows variously shaped supports to be employed and to be readily subjected to surface treatment, thereby brought the present invention to completion.

Figure 1:
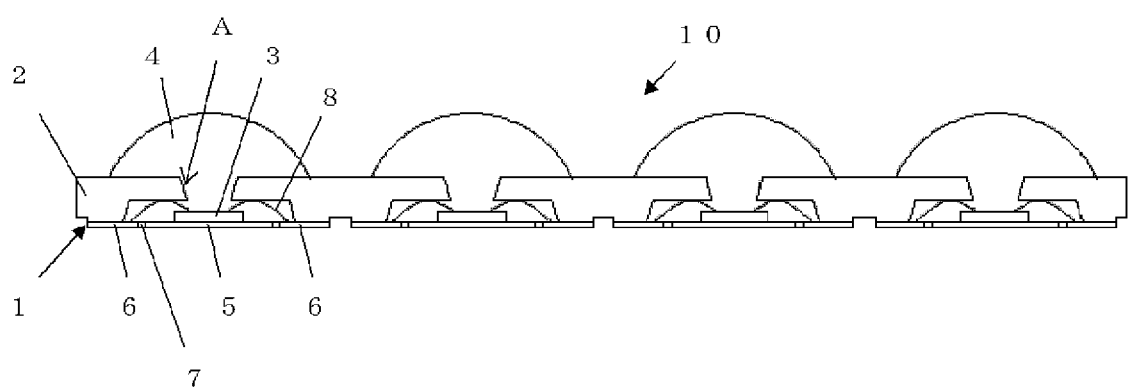
FIG. 1 is a schematic view of an example of a concentrating solar cell module of the present invention.

FIG. 1 is a schematic view of an example of a concentrating solar cell module of the present invention. As shown in FIG. 1, a concentrating solar cell module 10 includes a base portion 1, a support 2, solar cells 3, and condensing lenses 4. The concentrating solar cell module 10 is of an assemble type in which a plurality of solar cells 3 and condensing lenses 4 are arranged.

The base portion 1 has mounting regions 5 for mounting the solar cells 3, and lead electrodes 6 for electrically connecting the solar cells 3 with external electrodes. The mounting regions 5 and lead electrodes 6 are each provided so as to correspond to the solar cells 3 to be mounted.

The surface of each of the mounting regions 5 of the base portion 1 is plated. In addition, the surface of each of the lead electrodes 6 may be plated. Metal used for the plating is not particularly limited, and aluminum, chromium, zinc, gold, silver, platinum, nickel, palladium, or an alloy thereof (e.g., Ni—Ag and Ni—Pd—Au) can be used.

The base portion 1 may be a metal lead frame obtained by etching a metal plate to form lead electrodes, for example. In this case, as shown in FIG. 1, a resin may be embedded in portions 7 etched for forming the lead electrodes to strengthen the base portion 1. Alternatively, the base portion 1 may be a resin substrate, a ceramic substrate, or a glass cloth substrate having plated mounting regions 5 and lead electrodes 6 formed by plating the surface of the substrate.

The solar cells 3 are mounted on the respective mounting regions 5 plated in the above manner with a light-receiving portion faced upward. The heat dissipation properties of the concentrating solar cell module can therefore be significantly improved. The solar cells 3 are not particularly limited, and may be composed of a semiconductor of single crystal silicon, polycrystalline silicon, or III-V group compound, such as gallium arsenide, aluminum-gallium arsenide, and indium phosphorus gallium-indium phosphorus, for example.

The mounted solar cells 3 are preferably connected to the respective plated mounting regions 5 through a metal or a conductive thermosetting silicone resin.

Connecting the solar cells 3 to the mounting regions 5 makes handling easy during molding the condensing lens 4 in the production of the concentrating solar cell module, and prevents the heat dissipation properties from being reduced.

The support 2 is composed of a thermosetting resin and surrounds each of the mounting regions 5 on which the solar cells 3 are mounted. A supporting structure for the condensing lenses is formed by joining the support 2 onto the base portion 1. In an example of the concentrating solar cell module 10 shown in FIG. 1, the support 2 has an upper portion extending toward the center of the mounting region 5. The support 2 surrounds the wires 8 for connecting the solar cells 3 with lead electrodes 6. This configuration of the support 2 enables light absorption due to the wires 8 to be suppressed. Also, the presence of the wires does not need to be considered in design of a condensing lens.

The condensing lenses 4 are molded with a transparent thermosetting silicone resin above the respective mounting regions 5 so as to encapsulate the respective solar cells 3. For example, the condensing lens 4 may be in the form of a convex lens or a fresnel lens. Such a concentrating solar cell module is excellent in the photoelectric conversion efficiency.

It is effective to prevent light from passing through or being absorbed into the support 2 to ensure a high photoelectric conversion efficiency. Accordingly, the support 2 preferably have a high reflectance. In particular, the support is preferably molded with a thermosetting resin that contains a silicone resin and has a reflectance of 90% or more with respect to a light with a wavelength ranging from 350 nm to 900 nm. Such a concentrating solar cell module can ensure a high photoelectric conversion efficiency by improving efficiency of concentrating light and have a high heat resistance and a high durability.

In order to improve the reflectance of the support 2, the inner wall surface of the support 2 may be coated with metal by vapor deposition or plating. The reflectance of the support 2 can be increased to 99% by plating the inner wall surface of the support 2 with nickel, for example. Accordingly, the complicated conventional selection of a material can be eliminated, and a concentrating structure, that is, a structure for irradiating a solar cell with sunlight, can be configured only by the support 2, the base portion 1, and the condensing lens 4.

In the case where the upper portion of the support 2 extends toward the center of the mounting region 5 as shown in FIG. 1, "the inner wall" of the support 2 in the present invention means an inner surface including at least a side surface ("A" in FIG. 1) of the extending upper portion of the support 2, that is, a side surface of an opening formed above the solar cell 3. It is preferable to plate at least the side surface "A".

Metal used for plating the inner wall surface of the support 2 is not limited to nickel, and may be gold, which has a high reflectance, for example. In addition, a metal such as aluminum, chromium, zinc, silver, and platinum, an oxide such as $SiO_2$ and $TiO_2$, or a fluoride such as $ZrO_2$ and $MgF_2$ may be used. Further, not only plating but also vapor deposition may be performed. Adding a high-reflective substance such as titanium oxide into the support 2 enhances the reflectance of the support 2.

If necessary, the surface of the condensing lens 4 and/or the solar cell 3 may be coated with a protection film of a synthetic resin or a film for adjusting refractive index. The film prevents the surface from damaging due to an external factor and adjusts the refractive index to further improve the sunlight concentrating efficiency.

For the support 2, for example, a thermosetting resin such as an epoxy resin, a modified epoxy resin, a silicone resin, a modified silicone resin, an acrylate resin, a urethane resin, and a mixed resin of an epoxy resin and a silicone resin may be used.

Examples of the thermosetting resin include 1) a thermosetting silicone resin composition, 2) a thermosetting epoxy resin composition including a triazine derivative epoxy resin, an acid anhydride, a curing accelerator, and an inorganic filling agent, and 3) a hybrid resin (mixed resin) composition of a thermosetting silicone resin and an epoxy resin. However, the thermosetting resin is not limited to these resins, and may be determined according to the final application for a concentrating solar cell module.

Notable examples of the thermosetting silicone resin composition described above as 1) include a condensed thermosetting silicone resin composition represented by the following average composition formula (1):

$$R^1_a Si(OR^2)_b(OH)_c O_{(4-a-b-c)/2} \qquad (1)$$

wherein $R^1$ represents the same or different organic group having 1 to 20 carbon atoms, $R^2$ represents the same or different organic group having 1 to 4 carbon atoms, and "a", "b", and "c" represent numbers satisfying $0.8 \leq a \leq 1.5$, $0 \leq b \leq 0.3$, $0.001 \leq c \leq 0.5$, and $0.801 \leq a+b+c \leq 2$.

From the viewpoint of heat resistance and light stability, the triazine derivative epoxy resin in the thermosetting epoxy resin described above as 2) is preferably a 1,3,5-triazine nucleus derivative epoxy resin. The thermosetting epoxy resin composition is not limited to one including a triazine derivative and an acid anhydride as a curing agent, and may be conventionally known epoxy resin, amine, and phenol curing agent.

Examples of the hybrid resin of a silicone resin and an epoxy resin described above as 3) include a copolymer of an epoxy resin and a silicone resin.

An inorganic filler may be mixed in the silicone resin composition or the epoxy resin composition. As the inorganic filler to be mixed, a material that is generally mixed in a silicone resin composition or an epoxy resin composition can be used. Examples thereof include silica such as molten silica and crystalline silica, alumina, silicon nitride, aluminum nitride, boron nitride, glass fiber, a fibrous filler such as wollastonite, and antimony trioxide. The average particle diameter and the shape thereof are not particularly limited.

Titanium dioxide can be mixed in the resin composition used in the present invention. Titanium dioxide can be mixed as a white colorant to enhance the whiteness degree and improve the reflective efficiency of light. The unit lattice of the titanium dioxide may be a rutile type or an anatase type. Further, the average particle diameter and the shape thereof are not limited. In order to enhance the compatibility with a resin or an inorganic filler and the dispersibility, titanium dioxide can be surface-treated in advance with a hydrous oxide of Al or Si.

The filling amount of the titanium dioxide is preferably 2 to 30% by mass, and particularly preferably 5 to 10% by mass, relative to the whole amount of the composition. When the amount is 2% by mass or more, a sufficient whiteness degree can be obtained, and when the amount is 30% by mass or less, poor molding such as not filling and void is not seen.

The support 2 may contain at least one selected from the group consisting of a filler, a dispersing agent, a pigment, a fluorescent substance, a reflective substance, a light-shielding substance, and a fibrous inorganic material.

Such a concentrating solar cell module has high durability and high photoelectric conversion efficiency due to the support having high reflectivity and high strength.

Next, a method for producing a concentrating solar cell module of the present invention will be described.

Figure 4:
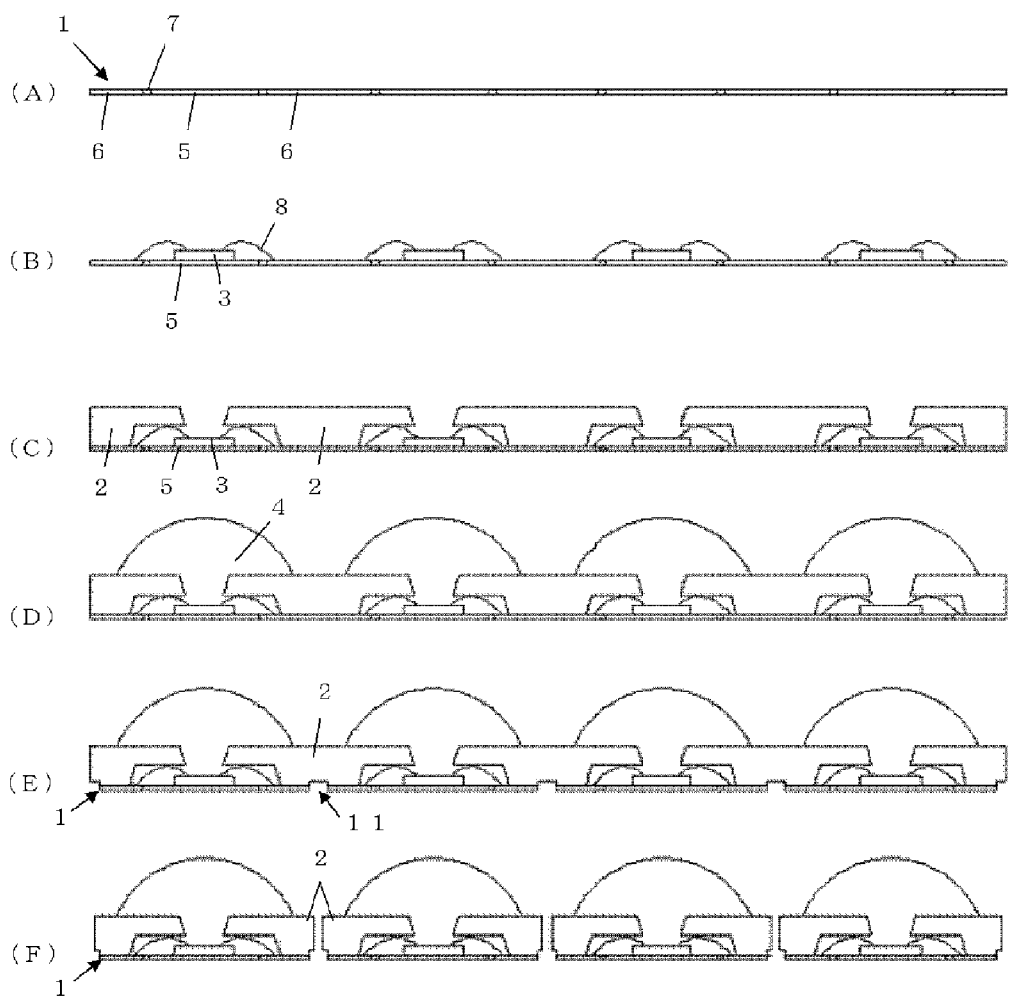
FIG. 4 is a flowchart of an example of a method for producing a concentrating solar cell module of the present invention.

As shown in FIG. 4, a base portion 1 having a plurality of mounting regions 5 for mounting a plurality of solar cells and a plurality of lead electrodes 6 for electrically connecting the solar cells with external electrodes are prepared. The surface of each of the mounting regions 5 of the prepared base portion 1 is plated. Further, a support 2 composed of a thermosetting resin, for providing a support structure that surrounds each of the mounting regions 5 of the base portion 1, is prepared separately from the base portion (FIG. 4 at (A): preparing step and plating step).

At this time, when the metal lead frame as described above is prepared as the base portion 1, a metal plate is etched to form lead electrodes, and the surface of each of the mounting regions 5 is plated. The surface of each of the lead electrodes 6 is also plated, if necessary. Thus, a concentrating solar cell module having high heat dissipation properties can be produced at low cost.

Alternatively, a resin substrate, a ceramic substrate, or a glass cloth substrate of which the surface is plated to form plated mounting regions 5 and lead electrodes 6 may be prepared as the base portion 1.

As shown in FIG. 4 at (A), a thermosetting resin may be filled in a portion 7, which is etched to form a lead electrode, of the base portion of the metal lead frame. Filling a thermosetting resin as above allows the concentrating solar cell module to be strengthen. The thermosetting resin may be filled by molding with a metal mold having a flat parting surface, for example.

As shown in FIG. 4(C), the separately prepared support 2 may have an upper portion extending toward the center of the mounting region 5. Alternatively, the support 2 may be formed into a concave shape that has a tapered inner surface and gradually widens upward. This support 2 can be molded by transfer molding or injection molding.

Next, the solar cells 3 are mounted on the respective plated mounting regions 5 (FIG. 4 at (B): mounting step). The solar cells 3 are mounted with a light-receiving portion faced upward. The solar cells 3 is preferably connected to the mounting regions 5 through a metal or a conductive resin paste. In this case, in consideration of heat dissipation properties and conductivity, Au—Sn is preferably used as the metal and a conductive thermosetting silicone resin is preferably used as the conductive resin paste.

The solar cells 3 can be electrically connected with the lead electrodes 6 through wires 8 such as gold wires or copper wires by wire bonding. Alternatively, the solar cells 3 can be electrically connected with the lead electrodes 6 through a sub-mount substrate.

Next, the prepared support 2 is joined to the base portion 1 (FIG. 4 at (C): support joining step). This step provides a support structure in which the support 2 surrounds each of the mounting regions 5, on which the solar cells 3 are mounted. The support 2 can be joined with a conductive paste or a resinous adhesive. At this time, the support 2 is desirably provided with a positioning pin to accurately position the support 2 at a desired position on the base portion 1. The thermosetting resin used for the support 2 may be the same as that described for the concentrating solar cell module.

In accordance with the present invention, a concentrating solar cell module including the support 2 formed to surround the wires, as shown in FIG. 4(C), can readily be produced, because the support 2 is joined to the base portion 1 after the step of mounting the solar cells 3. In other words, the degree of design freedom of the support and hence the collective lens can be increased, and thereby optical design can be simplified.

In order to configure a highly reflective structure of the support 2, a highly reflective substance such as titanium oxide may be mixed in the thermosetting resin. Alternatively, the inner wall surface of the support 2 may be coated with metal by vapor deposition or plating. This step can be performed before the support 2 is joined to the base portion 1, thereby obviating the need for masking the base portion during plating. This step can therefore be readily performed for a short time. Metal used for plating in this step may be the same as described in the concentrating solar cell module.

Subsequently, condensing lenses 4 are molded above the respective mounting regions 5 so as to encapsulate the respective solar cells 3 (FIG. 4 at (D): condensing lens molding step). This step involves pouring a fluid transparent thermosetting silicone resin into a space surrounded by the inner wall of the support 2 and over the space to mold the condensing lens 4. Thus, a concentrating solar cell module having excellent heat dissipation properties, heat resistance, and durability can be produced.

The condensing lenses 4 may be molded by compression molding, transfer molding, injection molding, or cast molding. Thus, the production can be simplified, the production efficiency can be improved, and the cost can be reduced. Alternatively, the condensing lenses 4 can be molded by dripping a resin.

Figure 5:
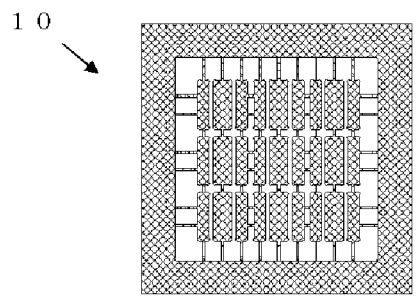
FIG. 5 is an explanatory view of a method for forming an electric circuit on a concentrating solar cell module.
Figure 5:
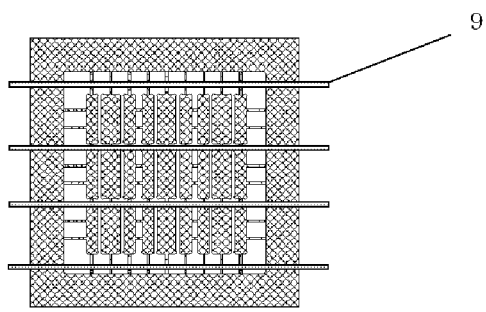
Figure 5:
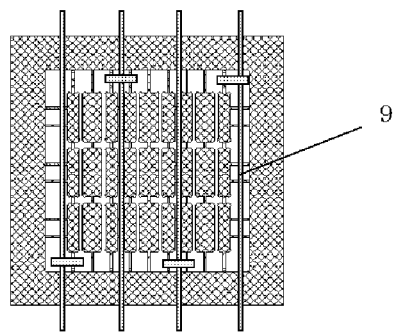
Figure 5:
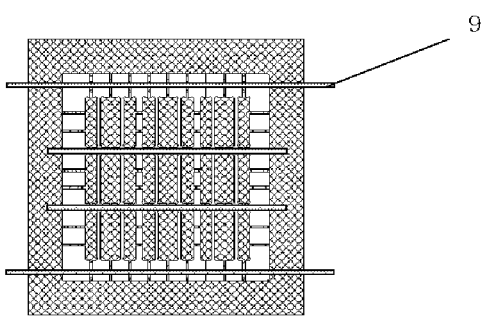

After the condensing lens molding step, a portion of the base portion 1 is cut to form an electric circuit, if necessary (FIG. 4 at (E)). FIG. 5 illustrates an example of a method for forming an electric circuit. At (A) in FIG. 5, the concentrating solar cell module 10 after molding of the condensing lens 4 is illustrated from its back side. At (B) to (D) in FIG. 5, the base portion 1 is cut with a dicing blade. As shown in FIG. 5 at (B) to (D), a portion of the base portion 1 is cut from the back side of the concentrating solar cell module with a dicing blade 9 in this step. At this time, only a portion of the base portion is cut or the base portion 1 and only a portion of the support 2 are cut, but the support 2 is not completely cut (half dicing), as indicated by the numeral 11 in FIG. 4 at (E). In this way, it is possible to form three kinds of electric circuits including a serial circuit (FIG. 5 at (B)), a parallel circuit (FIG. 5 at (C)), and a series-parallel circuit (FIG. 5 at (D)).

Forming the electric circuit in this way enables not only an inspection for checking electric short circuit and an open state during the production but also elimination of a printed circuit board for electrically connecting with external electrodes, and the concentrating solar cell module can thus be produced at low cost.

After the condensing lens molding step, the concentrating solar module may be cut by dicing into individual concentrating solar modules (FIG. 4 at (F)). In this step, as shown in FIG. 4 at (F), both the base portion 1 and the support 2 are completely cut by dicing (full dicing). Thus, individual concentrating solar cell modules can be mass-produced, and the productivity is significantly improved.

Figure 2:
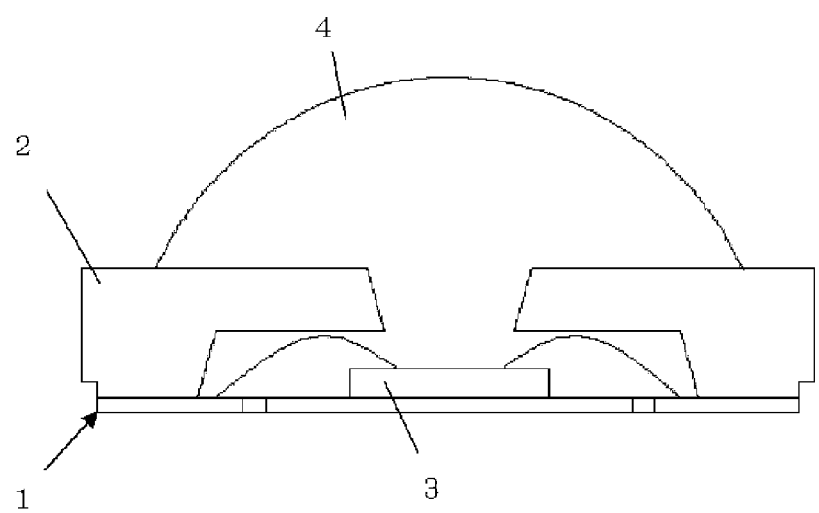
FIG. 2 is a schematic view of an example of an individual piece into which a concentrating solar cell module of the present invention has been cut.
Figure 3:
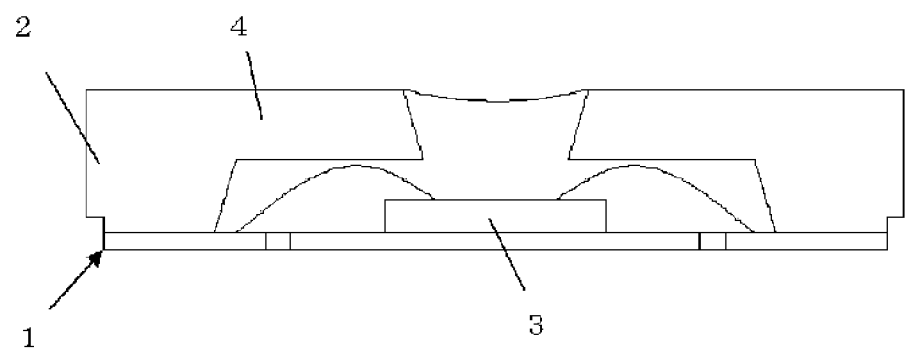
FIG. 3 is a schematic view of another example of an individual piece into which a concentrating solar cell module of the present invention has been cut.

FIGS. 2 and 3 show an example of an individual concentrating solar cell module. In the individual concentrating solar cell module shown in FIG. 2, the condensing lens 4 is molded with a mold such that the condensing lens 4 has an upward convex shape. In the individual concentrating solar cell module shown in FIG. 3, the condensing lens 4 is molded by dripping a resin through the surface tension with a dispenser such that the condensing lens 4 has a downward convex shape.

According to the production method including a step of cutting a concentrating solar cell module by dicing, a location of a solar battery is not restricted, and a space for a solar battery can be saved.

EXAMPLES

Hereinafter, the present invention will be more specifically described with reference to Examples and Comparative Example, but the present invention is not limited to these Examples.

Example 1

A plurality of mounting regions and lead electrodes were formed by using a Cu-based substrate (Tamac194 manufactured by Mitsubishi Shindoh Co., Ltd.) with a thickness of 0.25 mm through an etching process, and the surfaces of the mounting regions and the lead electrodes were plated with Ni/Pd/Au to produce a metal lead frame as a base portion, as shown in FIG. 4 at (A). The surface of the base portion was subjected to a plasma treatment under conditions of 50 W and 60 seconds.

An Au/Sn ribbon (manufactured by Sumitomo Metal Mining Co., Ltd., trade name: Alloy Preform, Au: 80%, Sn: 20%) was then cut to be disposed on the mounting regions. Solar cells (manufactured by Cyrium Technologies, three-junction compound type, 2.5 mm×2.5 mm) were then mounted on the mounting regions and subjected to eutectic bonding at 280° C. The mounted solar cells were electrically connected with the respective lead electrodes through gold wires of 30 μm.

The support was molded with a thermosetting silicone resin composition into a shape illustrated in FIG. 4 at (C) by a transfer molding machine. After connecting the solar cells, the inner wall surface of the support was plated with Ag, which has a reflectance of 97% with respect to a light with a wavelength ranging from 350 nm to 900 nm, and the support was then joined to the base portion through a silicone resin adhesive.

Then, condensing lenses were molded with a thermosetting silicone resin (available from Shin-Etsu Chemical Co., Ltd., trade name: KJR-9022) by a compression molding apparatus manufactured by TOWA Corporation.

As shown in FIG. 5 at (B), a portion of the base portion was then cut (half dicing) by a dicing blade having a thickness of 0.4 mm to form an electronic circuit in which three series electronic circuits with three solar cells are arranged in three rows. A concentrating solar cell module having the electronic circuit was thus produced. On the outer peripheral portion of the concentrating solar cell module, an energization probe was disposed, and connected with the lead electrodes to perform an energization test so that a connection state between the solar cell and the gold wires was checked.

Subsequently, the concentrating solar cell module was cut (full dicing) into nine concentrating solar cell modules, as shown in FIG. 2, by a dicing blade having a thickness of 0.2 mm. Since the cut concentrating solar cell modules had been already subjected to the energization test, the energization test and selection test after the cutting were not necessary. A plurality of I-V data was measured at once. Thus, the steps are simplified, the production efficiency was improved and the production cost is reduced.

Example 2

Three 70-μm sheets obtained by impregnating glass fibers with a thermosetting silicone resin composition containing alumina (available from Admatechs Company Limited, trade name: AO-502) as a metal oxide were stacked. A 75-μm copper layer was formed on the upper and lower surfaces of the layered sheets, and the surface of the copper layer was plated with Ni/Pd/Au to form a metal-coating layer. The metal-coating layer was etched to form lead electrodes, and thus a base portion was produced.

The support molded into a shape illustrated in FIG. 4 at (C) was then joined to the base portion through a thermosetting silicone resin composition containing titanium oxide as a high-reflective substance by a transfer molding apparatus.

Subsequently, a concentrating solar cell module was manufactured in the same manner as in Example 1.

Comparative Example

A support having a tapered shape in which the recess laterally extends gradually toward the top was molded integrally with polymethyl methacrylate (PMMA) on a FR-4 (flame retardant type 4) substrate to produce a base portion. On the flat bottom of recesses of the base portion, solar cells were fixed through solder with light-receiving portions faced upward. At this time, gallium arsenide solar cells were used.

Polystyrene was then poured into the recesses to encapsulate the solar cells. The encapsulated surfaces were each processed to form condensing lenses. The resultant was cut by dicing into individual concentrating solar cell modules.

The current-voltage characteristics of each of the concentrating solar cell modules produced in Examples 1 and 2 and Comparative Example were measured under irradiation of 1 kW/m$^2$ with a solar simulator (manufactured by Asahi Spectra Co., Ltd., HAL-320). The photoelectric conversion efficiency was evaluated.

TABLE 1

|  | Example 1 | Example 2 | Comparative Example |
|---|---|---|---|
| Photoelectric conversion efficiency (%) | 43 | 42 | 28 |

The results are given in Table 1. Table 1 shows that the concentrating solar cell modules in Examples 1 and 2 are more excellent in photoelectric conversion efficiency than one in Comparative Example.

The substrate thermal resistance values Rj-Hs from a junction to a heat sink of the concentrating solar cell modules produced in Examples 1 and 2 and Comparative Example were measured with a transient heat measuring apparatus (manufactured by Mentor Graphics, T3star), and compared.

The results are given in Table 2. Table 2 shows that the concentrating solar cell modules in Examples 1 and 2 have improved heat dissipation properties as compared with Comparative Example.

TABLE 2

|  | Example 1 | Example 2 | Comparative Example |
|---|---|---|---|
| Thermal resistance value (° C./W) | 25 | 30 | 50 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A concentrating solar cell module comprising:
   a base portion having a plurality of mounting regions for mounting solar cells and a plurality of lead electrodes for electrically connecting the solar cells with external electrodes;
   a support composed of a thermosetting resin, the support surrounding each of the mounting regions of the base portion;
   the solar cells mounted on the mounting regions; and
   a condensing lens molded above each of the mounting regions so as to encapsulate the solar cells,
   wherein a surface of each of the mounting regions of the base portion is plated, the condensing lenses are molded with a transparent thermosetting silicone resin, and the support is joined to a surface of the base portion, the surface to which the support is joined is on the same side of the base portion as the surface on which the solar cells are mounted, and
   wherein the concentrating solar cell module has a half dicing structure in which only a portion of the base portion is cut or the base portion and only a portion of the support are cut from a backside of the concentrating solar cell module.

2. The concentrating solar cell module according to claim 1, wherein the support is molded with a thermosetting resin that contains a silicone resin and has a reflectance of 90% or more with respect to a light with a wavelength ranging from 350 nm to 900 nm.

3. The concentrating solar cell module according to claim 1, wherein an inner wall surface of the support is coated with metal by vapor deposition or plating.

4. The concentrating solar cell module according to claim 2, wherein an inner wall surface of the support is coated with metal by vapor deposition or plating.

5. The concentrating solar cell module according to claim 1, wherein the support has an upper portion extending toward a center of the mounting region.

6. The concentrating solar cell module according to claim 4, wherein the support has an upper portion extending toward a center of the mounting region.

7. The concentrating solar cell module according to claim 1, wherein the mounted solar cells are connected to the respective plated mounting regions through a metal or a conductive thermosetting silicone resin.

8. The concentrating solar cell module according to claim 6, wherein the mounted solar cells are connected to the respective plated mounting regions through a metal or a conductive thermosetting silicone resin.

9. The concentrating solar cell module according to claim 1, wherein the support is formed from at least one material selected from a thermosetting silicone resin, an organic modified silicone resin, and a mixed resin of an epoxy resin and a silicone resin.

10. The concentrating solar cell module according to claim 1, wherein the support contains at least one selected from the group consisting of a filler, a dispersing agent, a pigment, a fluorescent substance, a reflective substance, a light-shielding substance, and a fibrous inorganic material.

* * * * *